(12) United States Patent
Arase et al.

(10) Patent No.: US 7,032,299 B2
(45) Date of Patent: Apr. 25, 2006

(54) APPARATUS FOR MOUNTING ELECTRONIC PARTS

(75) Inventors: Masayuki Arase, Saga (JP); Takayuki Hatase, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 608 days.

(21) Appl. No.: 10/174,951

(22) Filed: Jun. 20, 2002

(65) Prior Publication Data
US 2003/0017758 A1 Jan. 23, 2003

(30) Foreign Application Priority Data
Jun. 21, 2001 (JP) .............................. 2001-187725

(51) Int. Cl.
B23P 19/00 (2006.01)
(52) U.S. Cl. .............................. 29/740; 29/720; 29/739; 29/832; 29/834; 29/836; 356/419
(58) Field of Classification Search .................. 29/832, 29/721, 740, 834, 836, 739, 720; 356/419
See application file for complete search history.

(56) References Cited

U.S. PATENT DOCUMENTS

| | | | | |
|---|---|---|---|---|
| 3,869,212 A | * | 3/1975 | Burcher et al. ............. | 356/419 |
| 5,079,834 A | * | 1/1992 | Itagaki et al. ................. | 29/840 |
| 5,787,577 A | * | 8/1998 | Kent ............................ | 29/833 |
| 6,094,808 A | * | 8/2000 | Mimura et al. ............... | 29/743 |
| 6,557,251 B1 | * | 5/2003 | Hudson ....................... | 29/833 |

* cited by examiner

Primary Examiner—Richard Chang
(74) Attorney, Agent, or Firm—Wenderoth, Lind & Ponack, L.L.P.

(57) ABSTRACT

An apparatus for mounting electronic parts and a method of mounting electronic parts capable of effectively performing image capturing at the time of position recognition of the electronic parts. In the apparatus, when images of electronic parts are taken for position recognition of the parts in the mounting of a plurality of the electronic parts held by a mounting head on a circuit board, it is adapted such that pixel signals are output only from specific necessary pixels. More specifically, pixel selecting information for allowing image signals to be selectively output from a plurality of specific pixels of a photodetecting section (10) of a CMOS area sensor is generated based on mounting schedule data (16C) related to a mounting sequence of the electronic parts and part data of the electronic parts stored in data storage (16). A pixel selector (11) is operated in accordance with the pixel selecting information, and thus the image signals are output from the selected specific pixels.

5 Claims, 5 Drawing Sheets

APPARATUS FOR MOUNTING ELECTRONIC PARTS

BACKGROUND OF THE INVENTION

1. Field of the Invention

The present invention relates to an apparatus for and a method of mounting electronic parts on a circuit board.

2. Description of Related Art

Apparatuses for mounting electronic parts on a circuit board in general include an image reader performing position recognition of the electronic parts. Positioning of electronic parts for mounting the electronic parts at predetermined mounting positions on a circuit board is carried out on the basis of the results of the position recognition. As image readers, such as a line sensor in which a plurality of pixels are linearly arranged and an area sensor in which a plurality of pixels are arranged in a two-dimensional lattice form are used. By having an optical image formed on the photodetecting section of such an image reader, each pixel thereof comes to build thereon an electric charge corresponding to the optical image. By allowing such electric charges to be sequentially output as electric signals (image signals), image data representative of an electronic part can be obtained.

However, since it has been practiced in conventional mounting apparatuses to have image signals sequentially output from all of the pixels constituting the photodetecting section, image signals from pixels unnecessary for position recognition have also been output. Therefore, the time required for reading an image of an electronic part has been prolonged and this has made it difficult to shorten the time required for position recognition of an electronic part.

SUMMARY OF THE INVENTION

The present invention was developed for the purpose of solving the above described problem in the conventional art, and it is an object thereof to provide an apparatus for and a method of mounting electronic parts on a circuit board in which the time required for reading an image while performing position recognition of the electronic part can be shortened.

The apparatus for mounting electronic parts of the invention comprises:

(a) a mounting head holding and transferring a plurality of electronic parts;

(b) an image reader for taking an image of a plurality of the electronic parts held by the mounting head;

(c) an image recognition section for recognizing an image read by the image reader thereby detecting positions of a plurality of the electronic parts;

(d) a data storage for storing mounting schedule data specifying a mounting sequence of a plurality of the electronic parts performed by the mounting head and part data of a plurality of kinds of the electronic parts; and (e) a controller for causing the mounting head to perform mounting operation based on positions of the electronic parts detected by the image recognition section and the mounting schedule data, in which the image reader includes:

(b1) a photodetecting section having a plurality of pixels;

(b2) a pixel selecting information generating section for generating pixel selecting information specifying pixels becoming image capture regions in the photodetecting section based on the mounting schedule data and the part data; and (b3) a pixel selecting section for allowing image signals to be selectively output from specified pixels based on the pixel selecting information.

By virtue of the described configuration, pixel selecting information can be generated on the basis of the mounting schedule data related to the mounting sequence of the electronic parts and the part data of the electronic parts and, on the basis of this pixel selecting information, image signals can be generated from specific pixels in the photodetecting section. Therefore, image recognition required for making position recognition of mounted electronic parts can be performed quickly and efficiently and, thus, the mounting tact time can be shortened.

DETAILED DESCRIPTION OF THE INVENTION

A mounting apparatus and a mounting method according to an exemplary embodiment of the present invention will be described below with reference to FIG. 1 to FIG. 5.

Figure 1:
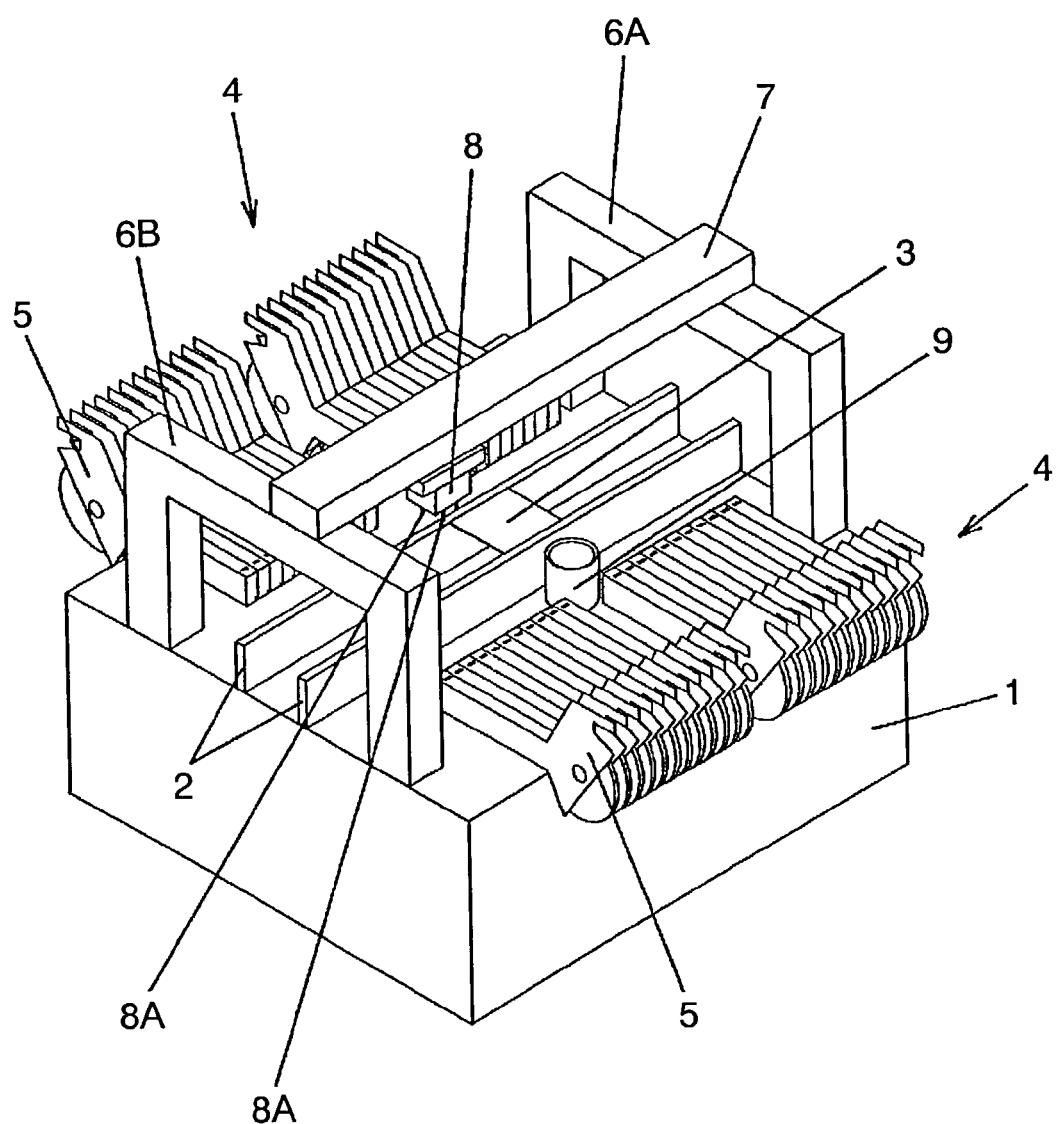
FIG. 1 is a perspective view of an apparatus for mounting electronic parts constructed in accordance with a first embodiment of the present invention.
Figure 2:
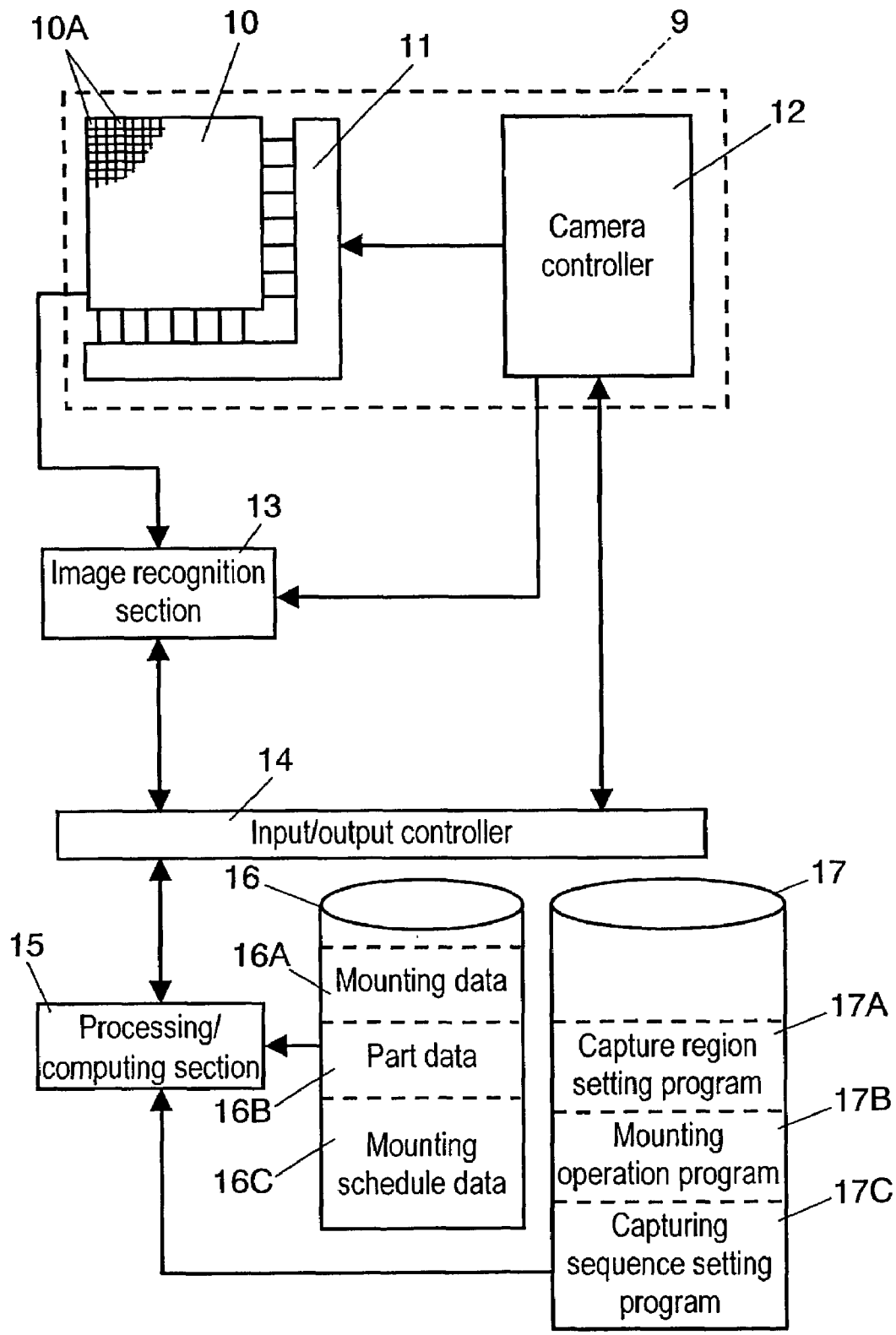
FIG. 2 is a block diagram showing a configuration of an image reader of the mounting apparatus.
Figure 3:
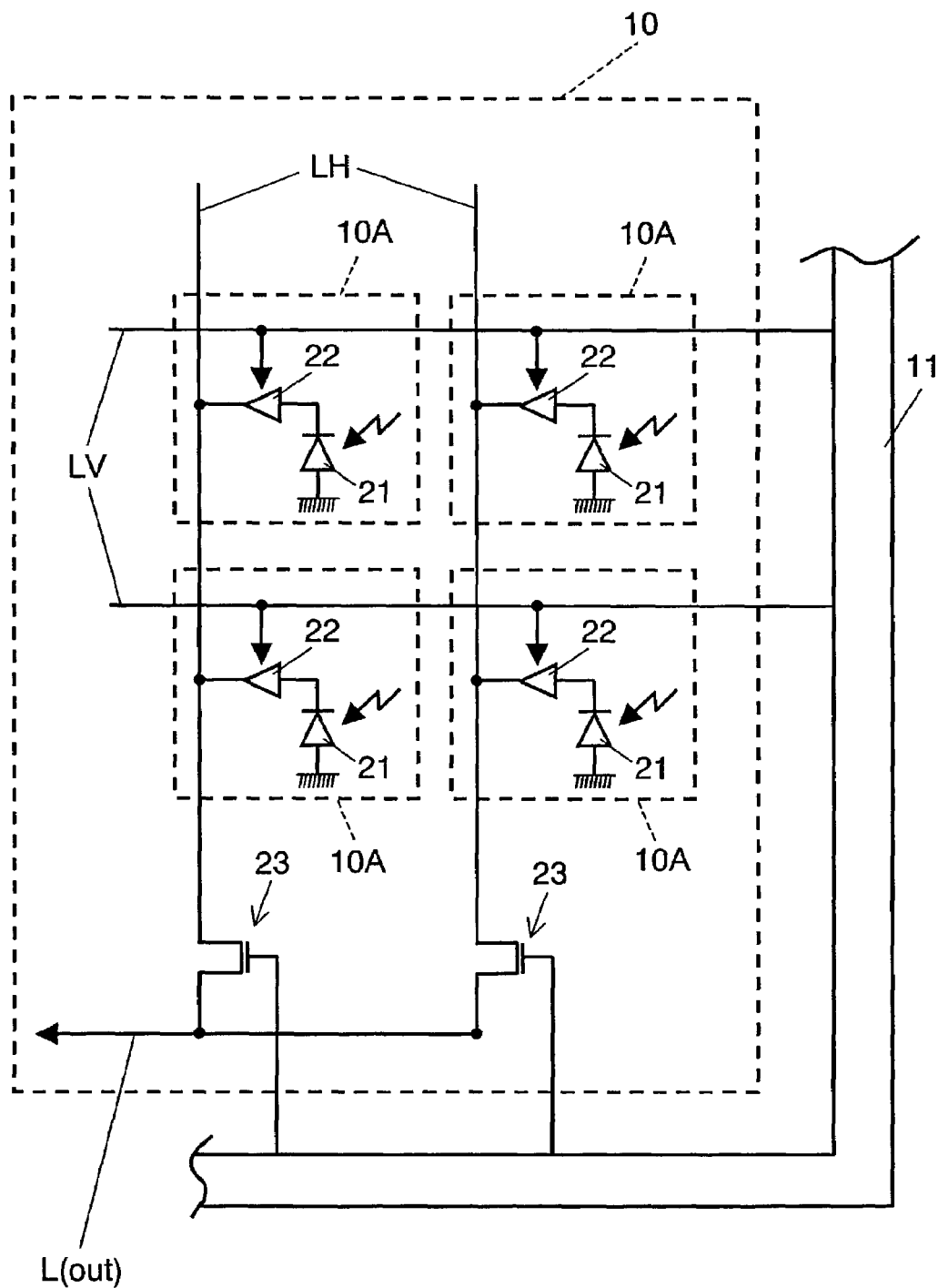
FIG. 3 is a structural drawing of a photodetecting section of the image reader.
Figure 4A:
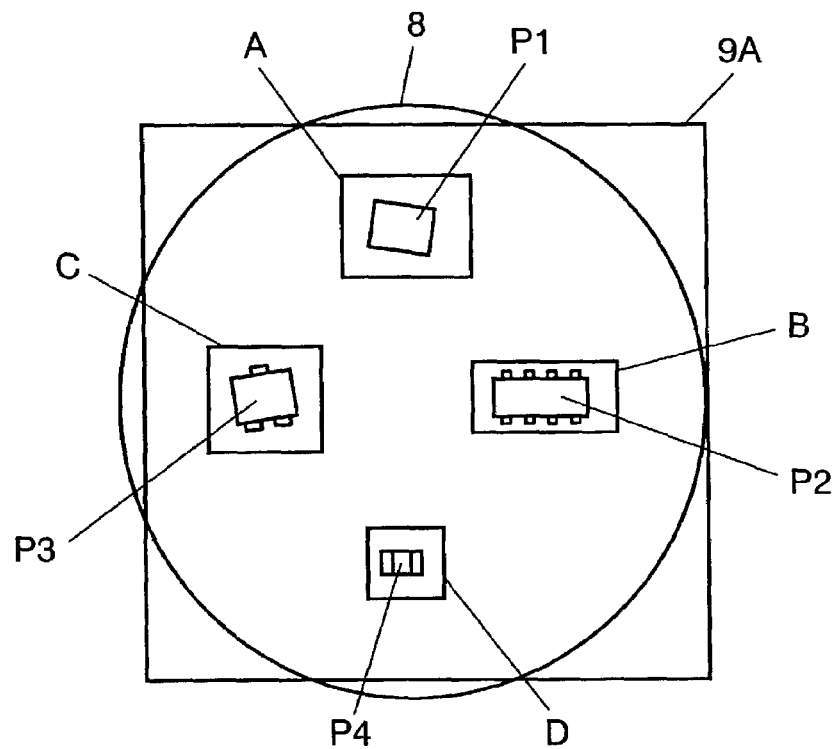
FIG. 4A is a drawing showing image capture windows of the image reader of the mounting apparatus.
Figure 4B:
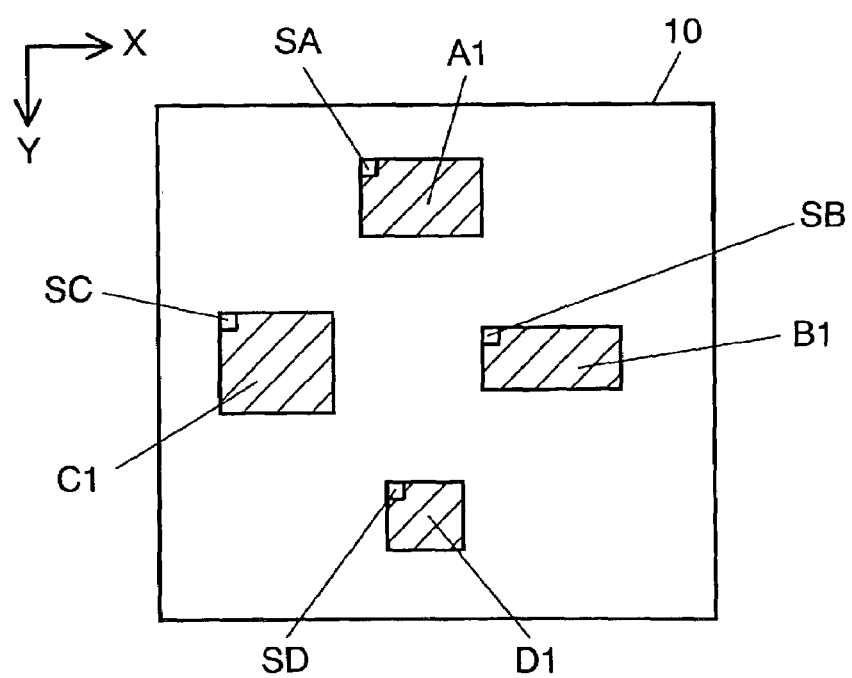
FIG. 4B is a drawing showing image capture regions in the photodetecting section of the image reader.
Figure 5:
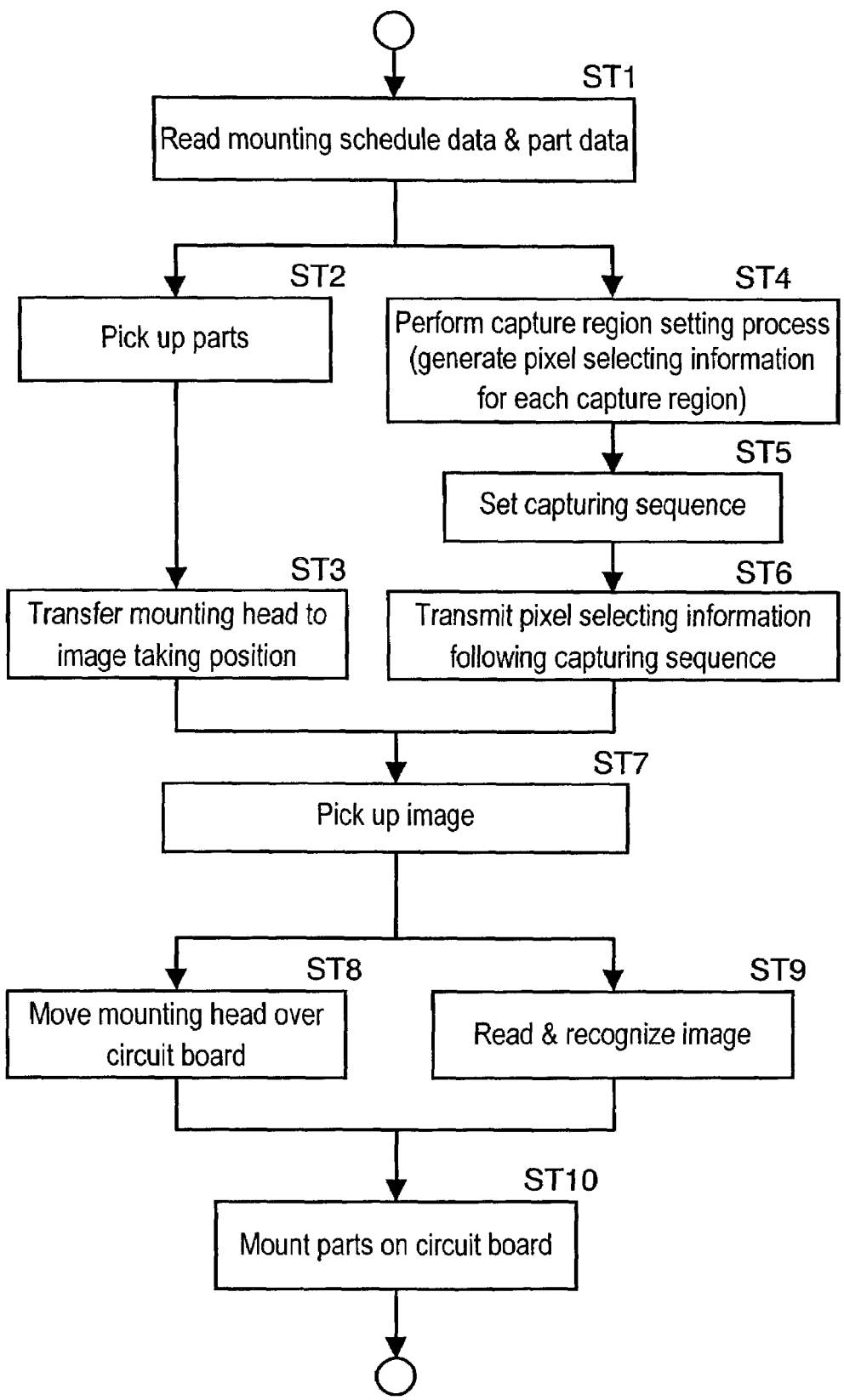
FIG. 5 is a flowchart showing a work flow in a method of mounting electronic parts in the illustrated embodiment.

FIG. 1 is a perspective view of the mounting apparatus constructed in accordance with the present invention. FIG. 2 is a block diagram illustrating the configuration of an image reader used in the apparatus. FIG. 3 is a drawing illustrating the configuration of the photodetecting section of the image reader and FIG. 4 is a drawing showing image capture windows of the image reader and image capture regions of the photodetecting section. FIG. 5 is a process flowchart for explaining the mounting method performed in the mounting apparatus.

The configuration of the mounting apparatus of the exemplary embodiment will first be described. As shown in FIG. 1, the mounting apparatus has guide rails 2 extending along a direction X in the center of a base board 1. The guide rails 2 are used for carrying circuit board 3 thereby positioning it in a predetermined position. Part supplying sections 4 for supplying electronic parts are disposed on both sides of the guide rails 2. Each part supplying section 4 is provided with a tape feeder 5. The tape feeder 5 contains a tape with electronic parts placed thereon and feeds the tape at a fixed pitch in the direction of a pickup position thereby supplying an electronic part to a predetermined pickup position.

Y-axis tables 6A and 6B are disposed both sides of the top face of the base board 1. The Y-axis tables 6A and 6B are parallel to each other, and on these tables, there is a disposed X-axis table 7 having both end portions thereof placed on the Y-axis tables 6A and 6B. The X-axis table 7 has a mounting head 8 placed thereon. The mounting head 8 is of a multi-nozzle type having four suction nozzles 8A provided in the bottom face thereof for sucking electronic parts. Since each of the four suction nozzles 8A can individually suck and hold an electronic part, the suction nozzles 8A can suck and hold a plurality of electronic parts and transfer them. The X-axis table 7 is capable of moving in the Y-axis direction along the top faces of the Y-axis tables 6A and 6B. The mounting head 8 is further allowed to move in the X-axis direction by means of X-axis table 7. Accordingly, mounting head 8 is horizontally movable in both the X-axis direction and the Y-axis direction. Thus, mounting head 8 is able to pick up an electronic part at a predetermined pickup position of tape feeder 5 and transfer the same to a position over circuit board 3 thereby mounting the same on circuit board 3.

A camera 9 is position along the path of mounting head 8 as it moves between guide rail 2 and part supplying portions 4. The camera 9 is an image reader for reading the image of an electronic part. After mounting head 8 has picked up an electronic part at a predetermined pickup position of the tape feeder 5, the mounting head 8 is moved over camera 9. When the electronic part has been positioned over the camera 9, by taking an image of the electronic part, while it is sucked and held by suction nozzle 8A the image of the electronic part is read by the camera 9 from below. Then, the obtained image data is subjected to recognition processing, and thus identification of the electronic part and position detection of the electronic part are carried out. When the electronic part is mounted on circuit board 3, the horizontal position of mounting head 8 and the direction of the nozzle are subjected to fine adjustments and, thus, the electronic part can be mounted in an accurate position.

FIG. 2 shows the configuration of the image reader. Camera 9 is made up of a photodetecting section 10, a pixel selector 11, and a camera controller 12. Photodetecting section 10 is formed of a plurality of pixels 10A in a lattice array. An optical image of the subject is formed on photodetecting section 10 by means of an optical system (not shown) and electric charges stored in each of the pixels are output as an image signal, whereby the image of the electronic part as the imaging subject is read. As shown in FIG. 3, each of the pixels 10A, which constitute photodetecting section 10, includes photodetecting element 21 being a photodiode and amplifier 22 made up of a plurality of MOS transistors. Amplifier 22 amplifies the electric charge stored on photodetecting element 21 to convert it into a voltage value to be output therefrom. Corresponding to the disposition of pixels 10A in a lattice array (in a two-dimensional matrix array), a plurality of vertical signal lines LV and a plurality of horizontal signal lines LH are formed in photodetecting section 10 and each amplifier 22 is connected with vertical signal line LV and horizontal signal line LH.

The manner of combination of vertical signal line LV and horizontal signal line LH connected to each of amplifiers 22 are entirely different from one another. Pixel selector 11 is connected with each of amplifiers 22 via vertical signal lines LV. Signals from pixel selector 11 render amplifiers 22 active or, more specifically, enables amplifiers 22 to output an image signal converted into a voltage value. Output of each of amplifier 22 is issued through output line L(out) via horizontal signal lines LH and gate element 23 for switching. One gate element 23 is connected to each of horizontal signal lines LH and caused to make its switching action by a signal from pixel selector 11.

With an optical image formed on photodetecting section 10, photodetecting element 21 stores electric charge corresponding to incident light thereon. With application of a signal from pixel selector 11 to turn ON gate element 23 in synchronism with amplifier 22 corresponding thereto, the electric charge stored in a related photodetecting element 21 is output as an image signal. More specifically, with a specific one of a plurality of vertical signal lines LV turned ON by pixel selector 11, a row of pixels 10A disposed in a horizontal direction in the lattice array of photodetecting section 10 is selected. Thus, a plurality of amplifiers 22 connected with these vertical signal lines LV are selected to be rendered active. Then, when one specific gate element 23, out of a plurality of gate elements 23, is selected to be turned ON by pixel selector 11, an image signal is output, through output line L(out), from one amplifier 22, of the plurality of amplifiers 22 rendered active, connected with that gate element 23 turned ON via the related horizontal signal line LH.

In FIG. 2, the camera controller 12 receives information necessary for operating pixel selector 11 from input/output controller 14 and controls pixel selector 11 based on the received pixel selecting information. Under the control of pixel selector 11, a signal from that pixel 10A selected by pixel selecting information is output. The camera controller 12 and pixel selector 11 constitute a pixel selecting section.

The camera controller 12 further issues an image capturing completion signal, indicative of completion of image capturing, to image recognition section 13. The image signal output from photodetecting section 10 is captured by an image recognition section 13. The image recognition section 13, upon receipt of the completion signal issued from camera controller 12, subjects the captured image data to recognition processing in accordance with a recognition algorithm designated by an algorithm number stored in part data 16B.

Input/output controller 14 controls input/output of exchanged signals among camera controller 12, image recognition section 13, and processing-computing section 15. Processing-computing section 15 executes processing programs stored in program storage 17 in accordance with stored data in a later described data storage 16, thereby performing various processing and computing jobs. The data storage 16 stores mounting data 16A, part data 16B, and mounting schedule data 16C.

The mounting data 16A is data of mounted positions of parts. The part data 16B is such data peculiar to each part, such as shape and size of the part to be mounted. As part data 16B, such data are also stored as the algorithm number given to an algorithm to be used by the image recognition section 13 for performing recognition and information of an image capture window to be set within the field of view of camera 9 for capturing an image. FIGS. 4A and 4B are drawings that explain the image capture window. In FIG. 4A, there are set four electronic parts P1, P2, P3, and P4, as well as image capture windows A, B, C, and D corresponding thereto, within image-taking field of view 9A. Because sizes and shapes of electronic parts are many and various, information for image capturing, i.e., size, shape, and number are set for each part. In the case of the present embodiment, an example in which one image capture window is provided for one electronic part is shown. However, a plurality of image capture windows can sometimes be set for one electronic part.

The mounting schedule data 16C is information related to the procedure of mounting work, i.e., the mounting work sequence of each electronic part is specified therein. More particularly, mounting schedule data 16C is read in order that each step of mounting work is performed, in which mounting head 8 travels between the part supplying sections 4 and circuit board 3 for the mounting work. By the read schedule data, a combination of a plurality of electronic parts simultaneously sucked, held, and transferred by mounting head 8 in each mounting work step and a sequence of mounting of each of individual electronic parts in that combination is designated. The aforesaid combination of a plurality of electronic parts may more particularly be explained as correspondences between the plurality of suction nozzles 8A of mounting head 8 and the kinds (part numbers and information identifying parts) of electronic parts sucked by the suction nozzles 8A.

The mounting schedule data 16C further includes such information as capturing sequence setting information for setting a capturing sequence on the basis of a sequence of mounting, for providing pixel selecting information in a plurality of image capture regions.

Program storage 17 stores capture region setting program 17A, mounting operation program 17B, and capturing sequence setting program 17C. The capture region setting program 17A is a program for generating pixel selecting information for selecting a plurality of particular pixels within the image capture regions corresponding to the image capture windows, out of a plurality of pixels 10A of photodetecting section 10, on the basis of the image capture windows set up in the image-taking field of view.

The procedure for the pixel selecting information generation will be described below. First, processing-computing section 15 reads out, from mounting schedule data 16C, the kinds of the electronic parts to be transferred to the image-taking field of view of camera 9 by mounting head 8 at each of the mounting steps, as well as information about suction nozzles 8A for sucking the electronic parts. Since positions of suction nozzles 8A within image-taking field of view 9A are each predetermined, the position of an electronic part within this image-taking field of view 9A can be determined by specifying the suction nozzle 8A that sucks the electronic part. On the other hand, from the read kind of electronic part, processing-computing section 15 reads out information about the image capture window for capturing the relevant electronic part in part data 16B. Then, from information about positions of each of electronic parts and image capture windows within image-taking field of view 9A, disposition of image capture windows A, B, C, and D within image-taking field of view 9A can be obtained as shown in FIG. 4A.

Then, in order to specify, within pixels 10A constituting photodetecting section 10, those pixels contained in image capture regions A1, B1, C1, and D1 corresponding to image capture windows A, B, C, and D, i.e., to specify pixels as the imaging subjects, pixel selecting information is generated based on the disposition of image capture windows A, B, C, and D. The image capture regions are shown in FIG. 4B.

In the described manner, processing-computing section 15 reads capture region setting program 17A and, further, reads out, from mounting schedule data 16C, information identifying the correspondence (combination) of kinds of electronic parts transferred by mounting head 8 at each mounting step with suction nozzles 8A sucking the electronic parts. Then, from the information identifying the correspondence and information about image capture windows included in part data 16B, processing-computing section 15 generates pixel selecting information for specifying the pixels within the image capture regions.

The mounting operation program 17B is a sequence program of the mounting operation for mounting electronic parts on circuit board 3. The capturing sequence setting program 17C is a program for setting a capturing sequence of a plurality of image capture regions provided in photodetecting section 10.

Accordingly, in the above described construction, processing-computing section 15 executes mounting operation program 17B on the basis of mounting schedule data 16C, while a controller as a function of processing/computing section 15 causes mounting head 8 to perform the mounting operation on the basis of both mounting schedule data 16C and data of positions of electronic parts detected by image recognition section 13. Likewise, processing-computing section 15 executes capture region setting program 17A to thereby generate pixel selecting information on the basis of both mounting schedule data 16C and part data 16B. Thus, pixel selecting information generating means is one of the functions of the processing/computing section 15.

The capturing sequence will be described now. In the conventional CCD area camera, issuance of image signals from the pixels is carried out following a scanning sequence determined in a fixed manner based on the arrangement of the pixels. Therefore, even in a case where there are set a plurality of image capture regions, the image capturing sequence is univocally determined. However, in a CMOS area camera in which pixels, as signal outputting subjects, can be selected at will as in the present exemplary embodiment, it is possible to set up as desired the sequence for image capturing in a plurality of image capture regions.

In order to perform the mounting work effectively, it at times is better to carry out image capturing from a plurality of image capture windows set in the simultaneously picked-up image-taking field of view in a specific sequence. For example, in a case where a plurality of the same electronic parts are to be mounted on circuit board 3 by the same mounting head 8 at the same mounting step, it saves mounting tact time if the captured image and the result of recognition of the image is output in the sequence of mounting of the electronic parts on circuit board 3. Therefore, in the present exemplary embodiment, outputting of the image signals from a plurality of image capture regions set up in photodetecting section 10 of camera 9 corresponding to the image capture windows is adapted to be determined in association with the mounting sequence of electronic parts specified in mounting schedule data 16C.

While the electronic part mounting apparatus of the present invention is configured as described above, the method of mounting electronic parts with the use of the apparatus will be described below according to the process flowchart shown in FIG. 5. Processing-computing section 15 reads out part data 16B and mounting schedule data 16C from data storage 16 (ST 1). The read data specifies the electronic parts as the mounted subjects at each of mounting steps and also specifies the mounting sequence of the electronic parts.

Then, mounting head 8 picks up the electronic parts as mounted subjects at this mounting step from predetermined pick-up positions of part supplying sections 4 (ST 2). Four suction nozzles 8A, provided on mounting head 8, pick up four different kinds of electronic parts P1, P2, P3, and P4 as shown in FIG. 4A. Then, the mounting head 8 is transferred to the image taking position over camera 9 (ST 3).

In parallel with the operation of mounting head 8, the following processes are performed. First, capture region setting process is performed on the basis of part data 16B that has been read (ST 4). Here, processing-computing section 15 executes capture region setting program 17A, thereby setting up, within image-taking field of view 9A, image capture windows A, B, C, and D corresponding to electronic parts P1, P2, P3 and P4 placed on mounting head 8, as shown in FIG. 4A.

Then, image capture regions A1, B1, C1, and D1 corresponding to image capture windows A, B, C, and D are set up in photodetecting section 10 of camera 9 as shown in FIG. 4B. Incidentally, SA, SB, SC, and SD in the drawing show starting pixels of image capture regions A1, B1, C1, and D1, respectively. Thereafter, pixel selecting information specifying the pixels in image capture regions A1, B1, C1, and D1 is generated, whereby the pixels as the subjects of issuance of image signals are specified.

Then, a capturing sequence setting process is performed (ST 5). Here, the capturing sequence is provided such that the image capturing is performed following the mounting sequence of four electronic parts P1, P2, P3, and P4 determined on the basis of mounting schedule data 16C. More particularly, when the mounting sequence is set in the order of P1, P2, P3, and P4, the capturing sequence is set in the order of A1, B1, C1, and D1.

Then, the pixel selecting information generated at step 4 (ST 4) is transmitted to camera controller 12, following the capturing sequence set at step 5 (ST 5), via input/output controller 14 (ST 6). Thus, camera 9 is enabled to take images. Then exposure through an optical system (not shown) is carried out so that an optical image of each electronic part, as an image-pickup subject, is formed on photodetecting section 10 and the image is picked up (ST 7).

When the image pick-up is completed, the mounting head 8 is transferred to the position over circuit board 3 (ST 8). In parallel therewith, image reading and recognizing processes are performed (ST 9). More specifically, image signals only from pixels corresponding to image capture regions A1, B1, C1, and D1 out of all pixels 10A in photodetecting section 10 are issued to image recognition section 13. At this time, image signals from the pixels in image capture region A1 are first output following the capturing sequence set in step 5 (ST 5). Upon completion of issuance of image signals from all pixels in image capture region A1, image signals are issued from pixels in image capture region B1 that follows. Upon completion of issuance of image signals from all pixels in image capture region B1, image signals are issued from pixels in image capture region C1 that follows. Likewise, image signals from image capture region D1 are issued following the issuance from region C1. The captured image signals, upon completion of the image capturing from each image capture region, are immediately subjected to recognition processing in image recognition section 13.

Then, mounting of an electronic part on circuit board 3 is performed (ST 10). More specifically, mounting head 8 mounts the electronic part on circuit board 3 after correcting displacement of the electronic part on the basis of the results of the recognition of the electronic part in image recognition section 13. At this time, one electronic part captured by and recognized in image recognition section 13 can be mounted on circuit board 3, without waiting for the completion of capturing of images, and recognition thereof, from all of the image capture regions of photodetecting section 10. Therefore, it is not necessary to wait until image capturing and recognition processing for all of the electronic parts is completed. As a result, unproductive standby time can be decreased and mounting tact time can be shortened.

In the present embodiment, an example where pixel selecting information is generated by using information of image capture windows included in the part data was shown. However, information of image capture windows may be eliminated from the part data and, instead, a function of generating information of image capture windows from information about sizes of electronic parts in the part data may be added to the capture region setting program 17A so that pixel selecting information is automatically generated from information about sizes of electronic parts. Although the number of nozzles provided on the mounting head was set to be four in the above-described embodiment, the number is of course not limited to four in the present invention.

According to the present invention, since pixel selecting information is generated based on mounting schedule data related to the mounting procedure of electronic parts and part data of electronic parts and image signals are output from particular pixels of the photodetecting section based on that pixel selecting information, efficient image reading can be achieved.

What is claimed is:

1. An apparatus for mounting electronic parts comprising:
   (a) a mounting head for holding and transferring electronic parts;
   (b) an image reader for taking images of the electronic parts when held by said mounting head;
   (c) an image recognition section for recognizing the images taken by said image reader so as to detect positions of the electronic parts when held by said mounting head;
   (d) a data storage for storing mounting schedule data specifying a mounting sequence to be performed by said mounting head for the electronic parts when held by said mounting head, and for storing part data of kinds of the electronic parts, with the part data including image capture window information indicative of image capture windows to be set within an image-taking field of view of said image reader; and
   (e) a controller for causing said mounting head to perform a mounting operation based on positions of the electronic parts, as detected by said image recognition section, and the mounting schedule data, wherein
said image reader includes:
   (b1) a photodetecting section having pixels;
   (b2) a pixel selecting information generating section for generating, based on the mounting schedule data and the image capture window information, pixel selecting information specifying some of the pixels, as specified pixels, that are to become image capture regions in said photodetecting section; and
   (b3) a pixel selecting section for allowing image signals to be selectively output from the specified pixels.

2. The apparatus for mounting electronic parts according to claim 1, wherein:
   said mounting head includes suction nozzles for sucking and holding the electronic parts,
   the mounting schedule data includes information specifying correspondences between said suction nozzles and the electronic parts to be sucked and held by said suction nozzles, and
   said pixel selecting information generating section is also for generating the pixel selecting information based on the information specifying the correspondences between said suction nozzles and the electronic parts to be sucked and held by said suction nozzles.

3. The apparatus for mounting electronic parts according to claim 1, wherein:
   the part data includes size information related to sizes of the electronic parts, and
   said pixel selecting information generating section is also for generating the pixel selecting information based on the size information related to the sizes of the electronic parts.

4. The apparatus for mounting electronic parts according to claim 1, wherein:
  the mounting schedule data includes mounting sequence information for the electronic parts and capturing sequence setting information for setting a capturing sequence based on the mounting sequence, for providing the pixel selecting information for the image capture regions, and
  said pixel selecting section is for selectively outputting image signals from the specified pixels following the capturing sequence.

5. The apparatus for mounting electronic parts according to claim 1, wherein:
  said mounting head has nozzles for sucking the electronic parts, and said mounting head is adapted to repeat mounting steps several times by reciprocally moving between a part supplying section and a circuit board so as to mount the electronic parts and other electronic parts onto a circuit board,
  the mounting schedule data includes information specifying correspondences between said nozzles and those of the electronic parts and the other electronic parts that are to be transferred at each mounting step, and
  said pixel selecting information generating section is also for generating the pixel selecting information based on the information specifying the correspondences between said nozzles and those of the electronic parts and the other electronic parts that are to be transferred at each mounting step.

* * * * *